United States Patent [19]

Wellnitz et al.

[11] Patent Number: 5,561,391
[45] Date of Patent: Oct. 1, 1996

[54] CLAMP CIRCUIT AND METHOD FOR DETECTING AN ACTIVATION OF SAME

[75] Inventors: Keith M. Wellnitz; Randall T. Wollschlager, both of Chandler, Ariz.; John Hargedon, Norwood, Mass.

[73] Assignee: Motorola, Inc., Schaumburg, Ill.

[21] Appl. No.: 522,475

[22] Filed: Aug. 31, 1995

[51] Int. Cl.$^6$ .................................................. H03K 5/08
[52] U.S. Cl. .................. 327/309; 327/326; 327/541; 327/545; 327/580
[58] Field of Search ................................ 327/309, 322, 327/326, 421, 580, 545, 541

[56] References Cited

U.S. PATENT DOCUMENTS

| | | | |
|---|---|---|---|
| 5,005,061 | 4/1991 | Robb et al | 357/23.13 |
| 5,115,369 | 5/1992 | Robb et al. | 361/93 |
| 5,365,099 | 11/1994 | Phipps et al. | 357/328 |
| 5,381,105 | 1/1995 | Phipps | 324/765 |
| 5,434,527 | 7/1995 | Antone | 327/309 |
| 5,467,050 | 11/1995 | Clapp, III et al. | 327/309 |

*Primary Examiner*—Margaret Rose Wambach
*Attorney, Agent, or Firm*—Rennie William Dover

[57] ABSTRACT

A clamp circuit (50) for protecting a MOSFET (52) from destructive voltages includes a clamping element (56), a Zener diode (64), two current mirrors (66 and 62), a current switch (58), a reference current source (68), and a voltage detector (72). When a drain voltage of the MOSFET (52) rises above a clamping voltage of the clamp circuit (50), a clamping current exceeding a current in the current switch (58) flows through the clamping element (56) and activates the MOSFET (52). During the activation, the two current mirrors (66 and 62) generate an output current exceeding a reference current in the reference current source (68) and raise a voltage at an input terminal of the voltage detector (72). The voltage detector (72) generates a signal indicating the activation of the clamp circuit (50), thereby indicating that the clamp circuit (50) and its inductive load (74) are intact.

20 Claims, 2 Drawing Sheets

CLAMP CIRCUIT AND METHOD FOR DETECTING AN ACTIVATION OF SAME

BACKGROUND OF THE INVENTION

The present invention relates, in general, to using a clamp circuit to protect a semiconductor device, and more particularly, to detecting the status of the clamp circuit.

Power semiconductor devices are used in high power applications such as automotive electronics, machine automation, and the like. For example, a power semiconductor device such as a power metal oxide semiconductor field effect transistor (MOSFET) is frequently used to switch an inductive load. When the power MOSFET is switched off, the inductive energy stored in the inductive load generates a surge in the drain voltage of the power MOSFET. A drain-gate clamp is typically employed to protect the power MOSFET from an avalanche stress induced failure that may be caused by such a voltage surge. The clamp diode has an avalanche voltage slightly less than that of the power MOSFET. When the drain-source voltage of the power MOSFET rises above the avalanche voltage of the clamp diode, a current flows through the clamp diode. The current activates the power MOSFET by developing a voltage across a resistor placed between the gate and source electrodes of the power MOSFET. The power MOSFET is turned on and dissipates all of the inductive energy in a less stressful conduction mode. A blocking diode is usually placed in series with the drain-gate clamp diode to block current flow from the gate to the drain of the power MOSFET.

Activation of the clamp circuit when switching off the power MOSFET indicates that the inductive load is intact. A malfunctioning inductive load, such as an open load or a shorted load, does not store inductive energy and, therefore, cannot activate the clamp circuit. Therefore, detecting the activation of the clamp circuit provides a diagnosis of the state of the inductive load as well as the state of the clamp circuit.

One approach for inferring the clamp circuit activation is to detect when the power MOSFET drain voltage exceeds a predetermined value. The approach uses a voltage divider to scale the drain voltage of the power MOSFET. The scaled drain voltage is transmitted to a comparator and compared with a reference voltage. The comparator generates an output signal when the scaled drain voltage exceeds the reference voltage. This approach does not directly detect the activation of the clamp circuit, but detects whether the drain voltage of the power MOSFET reaches a predetermined value. It is possible to have a drain voltage sufficient to generate the output signal but insufficient to activate the clamp circuit. It is also possible for the clamp circuit to be activated by a drain voltage that is insufficient to generate the output signal., Furthermore, because this approach is sensitive to the supply voltage level, the reference voltage may need to be adjusted whenever the supply voltage changes. In addition, the voltage divider is directly connected to the drain of the power MOSFET, where the voltage may reach a very high value when switching off the power MOSFET. The voltage divider also increases the drain leakage current. In a battery application where the load remains connected to the battery, any drain leakage is undesirable.

Accordingly, it would be advantageous to have a method for detecting the activation of a clamp circuit. It would be of further advantage for the method to be simple and reliable, and for the clamp circuit to have minimum current leakage and be suitable for manufacture using conventional manufacturing techniques.

DETAILED DESCRIPTION OF THE DRAWINGS

Generally, the present invention provides a clamp circuit and a method for using the clamp circuit to protect a transistor from destructive voltages. In one embodiment, the present invention provides a method for detecting the activation of the clamp circuit when switching off the transistor which is coupled to an inductive load, thereby providing a diagnosis of the clamp circuit and the inductive load.

Figure 1:
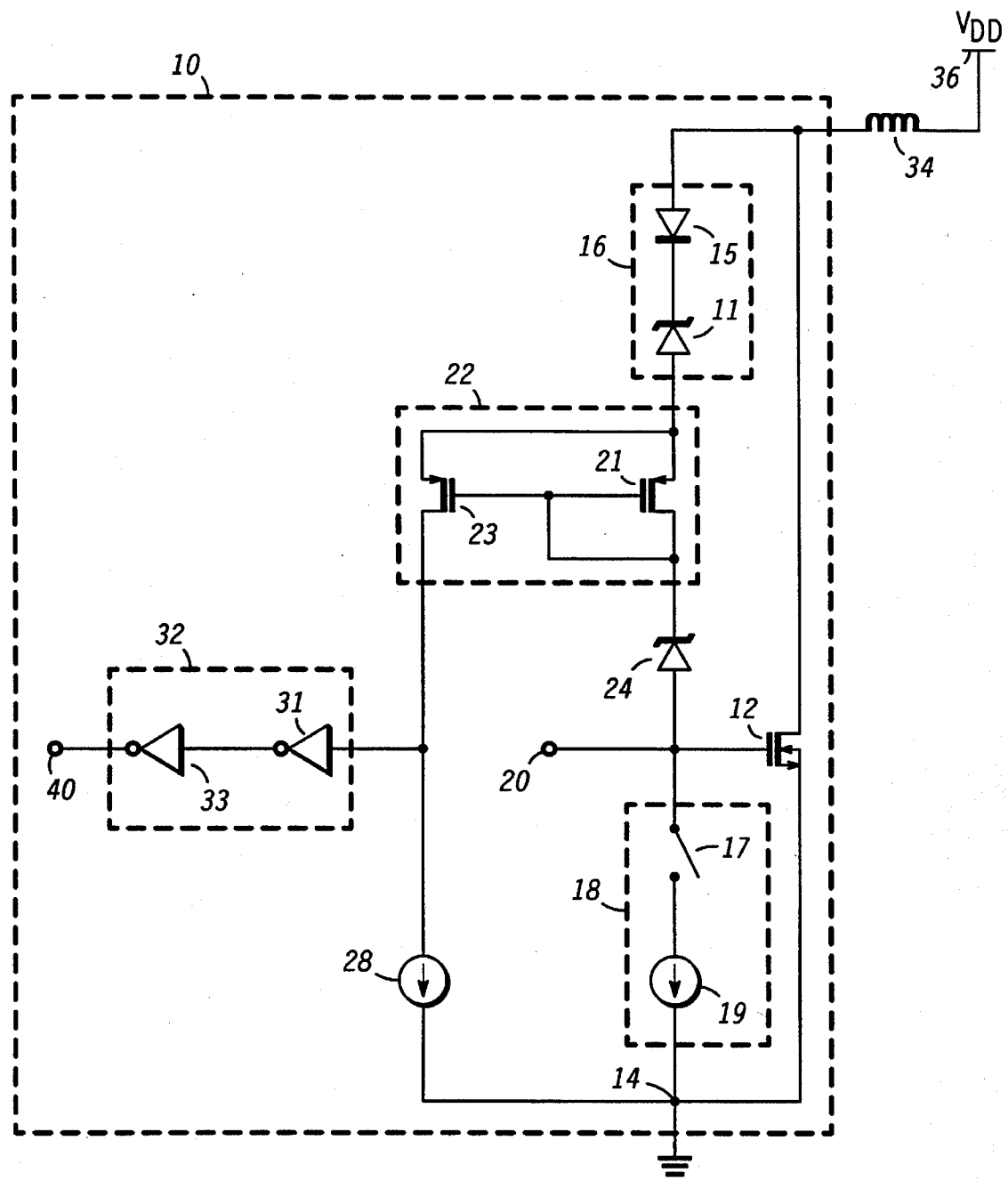
FIG. 1 illustrates a schematic diagram of a clamp circuit in accordance with a first embodiment of the present invention.

FIG. 1 illustrates a schematic diagram of a clamp circuit 10 in accordance with a first embodiment of the present invention. Clamp circuit 10 protects a power metal oxide semiconductor field effect transistor (MOSFET) 12 from destructive voltages. Power MOSFET 12 has a gate electrode coupled for receiving a control signal at a node 20 and a source electrode connected to a node 14. Node 14 is connected to, for example, a ground potential which serves as a reference potential. The gate electrode of power MOSFET 12 is further coupled to node 14 via a current switch 18. Although FIG. 1 illustrates current switch 18 as a series combination of a switch 17 and a current source 19, it should be understood that this is not a limitation of the present invention. Other suitable structures for current switch 18 include a single transistor, a switch in a series connection with a transistor, two transistors in a series connection, or the like. It should be understood that the present invention is not limited to providing protection for a power MOSFET as illustrated in FIG. 1. Power MOSFET 12 in clamp circuit 10 can be replaced by, for example, a bipolar transistor, an insulated gate bipolar transistor, a metal semiconductor field effect transistor, or the like. When interchanging bipolar transistors with field effect transistors, it should be noted that for a field effect transistor, a gate electrode serves as a control electrode of the transistor, and a source electrode and a drain electrode serve as current conducting electrodes; for a bipolar transistor, a base electrode serves as a control electrode of the transistor, and an emitter electrode and a collector electrode serve as current conducting electrodes.

Clamp circuit 10 also includes a clamping element 16 having a first clamping terminal connected to a drain electrode of power MOSFET 12 and a second clamping terminal coupled to the gate electrode of power MOSFET 12 via a current mirror 22 and a Zener diode 24. Clamping element 16 includes a blocking diode 15 and a Zener diode 11. Blocking diode 15 has an anode electrode serving as the first clamping terminal of clamping element 16 and a cathode electrode connected to a cathode electrode of Zener diode 11. An anode electrode of Zener diode 11 serves as the second clamping terminal of clamping element 16. It should be noted that the numbers of blocking diodes and Zener diodes in clamping element 16 and the number of Zener diodes represented by Zener diode 24 are not limited to those illustrated in FIG. 1. However, at least one blocking diode is needed to block current flowing from the gate electrode to the drain electrode of power MOSFET 12. The number of Zener diodes in clamping element 16 and the number of Zener diodes represented by Zener diode 24 determines the clamping voltage of clamp circuit 10. The diodes in clamping element 16 and the diodes represented by Zener diode 24 are oriented so that the current flows through a Zener diode from its cathode electrode to its anode electrode and through a blocking diode from its anode electrode to its cathode electrode when clamp circuit 10 is activated.

Current mirror 22 includes two p-channel insulated gate field effect transistors (FET) 21 and 23. A source electrode of FET 21 and a source electrode of FET 23 form a common terminal of current mirror 22 and are connected to the second clamping terminal of clamping element 16. A drain electrode of FET 21 serves as an input terminal of current mirror 22 and is connected to the gate electrode of power MOSFET 12 via Zener diode 24. A gate electrode of FET 21 and a gate electrode of FET 23 are connected to the drain electrode of FET 21. A drain electrode of FET 23 serves as an output terminal of current mirror 22 and is connected to node 14 via a reference current source 28. The input terminal of a current mirror is also referred as the reference terminal. It should be understood that the structure of current mirror 22 is not limited to that illustrated in FIG. 1. Current mirror 22 may be replaced by any current mirror having a current flowing into its common terminal. In addition, FETs 21 and 23 are not limited to being p-channel insulated gate field effect transistors. For example, FET 21 and FET 23 may be replaced by two PNP bipolar transistors. However, it should be noted that the type of FET 23 should be the same as the type of FET 21, i.e., if FET 21 is a p-channel insulated gate field effect transistor, so is FET 23.

Current source 28 is designed to generate a reference current proportional to the current generated by current source 19. This is achieved by deriving the reference current and the current in current source 19 from one biasing element. In one example, current source 19 and reference current source 28 are related to each other through a current mirror.

Clamp circuit 10 further includes a voltage detector 32 having an input terminal connected to the output terminal of current mirror 22 and an output terminal 40 coupled for transmitting an output signal. Voltage detector 32 is illustrated in FIG. 1 as including two inverters 31 and 33. This should not be interpreted as a limitation of the present invention. For example, voltage detector 32 can include a single inverter, a single buffer, or combinations thereof.

In operation, an inductive load 34 such as, for example, a solenoid, is connected to clamp circuit 10 at the drain electrode of power MOSFET 12. Inductive load 34 is also connected to a node 36, which in turn is coupled for receiving a potential such as, for example, a supply voltage, $V_{DD}$. When a control signal places power MOSFET 12 in a non-conductive state and closes switch 17, the inductive energy stored in inductive load 34 is released and raises the drain voltage of power MOSFET. This phenomenon is also referred as an inductive fly-back. When the drain voltage of power MOSFET 12 reaches a clamping voltage, a clamping current flows through clamping element 16 and current mirror 22. The clamping current continues to rise until a switching current in Zener diode 24 exceeds the current generated by current source 19. As those skilled in the art are aware, current source 19 will develop a voltage across the gate and source electrodes of power MOSFET 12 and thereby switch power MOSFET 12 into a conductive state. Power MOSFET 12 remains in the conductive state until the inductive energy stored in inductive load 34 is dissipated.

For clamp circuit 10, the clamping voltage is the sum of the total avalanche voltage of the Zener diodes in clamping element 16 and Zener diode 24, the voltage across the blocking diode in clamping element 16, the voltage across the source and drain electrodes of FET 21, and the voltage across current switch 18. Activation of clamp circuit 10 occurs when the switching current in Zener diode 24 exceeds the current generated by current source 19 and switches power MOSFET 12 on.

Current mirror 22 generates an output current in the drain electrode of FET 23. The output current of current mirror 22 is proportional to the switching current, wherein the coefficient of proportionality is equal to the ratio of the channel width divided by the channel length (W/L) of FET 23 to W/L of FET 21. The reference current in reference current source 28 is designed to be proportional to the current in current source 19, where the coefficient of proportionality is the same as that of the output current of current mirror 22 to the switching current in the input terminal of current mirror 22. Thus, the output current of current mirror 22 exceeds the reference current when clamp circuit 10 is activated. In response to the output current of current mirror 22 exceeding the reference current, reference current source 28 develops a voltage at the input terminal of voltage detector 32, which in turn generates a logical high signal at output terminal 40 indicating the activation of clamp circuit 10.

Figure 2:
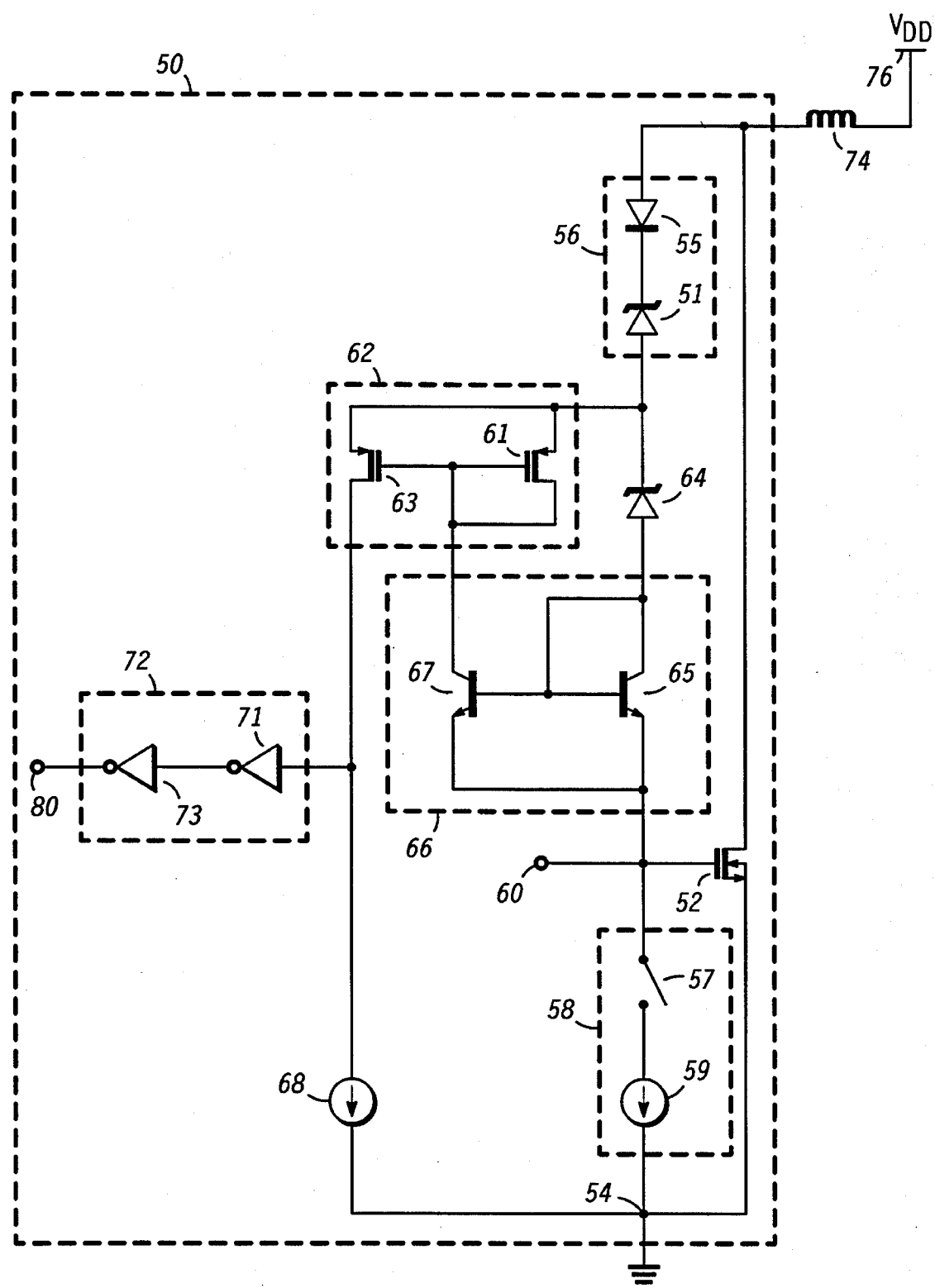
FIG. 2 illustrates a schematic diagram of a clamp circuit in accordance with a second embodiment of the present invention.

FIG. 2 illustrates a schematic diagram of a clamp circuit 50 in accordance with a second embodiment of the present invention. Clamp circuit 50 protects a power MOSFET 52. Power MOSFET 52 has a gate electrode coupled for receiving a control signal at a node 60, a source electrode connected to a node 54, and a drain electrode coupled for receiving a load signal. Node 54 is connected, for example, to a ground potential which serves as a reference potential. The gate electrode of power MOSFET 52 is further coupled to node 54 via a current switch 58. Although FIG. 2 illustrates current switch 58 as a series combination of a switch 57 and a current source 59, it should be understood that this is not a limitation of the present invention. Other suitable structures for current switch 58 include a single transistor, a switch in a series connection with a transistor, two transistors in a series connection, or the like. It should also be understood that the present invention is not limited to providing protection for a power MOSFET as illustrated in FIG. 2. Power MOSFET 52 in clamp circuit 50 can be replaced by, for example, a bipolar transistor, an insulated gate bipolar transistor, a metal semiconductor field effect transistor, or the like.

Clamp circuit 50 also includes a clamping element 56 having a first clamping terminal connected to the drain electrode of power MOSFET 52 and a second clamping terminal coupled to a current mirror 66 via a Zener diode 64. Clamping element 56 includes a blocking diode 55 and a Zener diode 51. Blocking diode 55 has an anode electrode serving as the first clamping terminal of clamping element 56 and a cathode electrode connected to a cathode electrode of Zener diode 51. An anode electrode of Zener diode 51 serves as the second clamping terminal of clamping element 56. It should be noted that the numbers of blocking diodes and Zener diodes in clamping element 56 and the number of Zener diodes represented by Zener diode 64 are not limited to those illustrated in FIG. 2. The total number of Zener diodes determines the clamping voltage of clamp circuit 50. The Zener and blocking diodes in clamping element 56 and the diodes represented by Zener diode 64 are oriented so that the current flows through a Zener diode from its cathode electrode to its anode electrode and through a blocking diode from its anode electrode to its cathode electrode when clamp circuit 50 is activated.

Current mirror 66 includes two NPN bipolar transistors: a mirror transistor 65 and an image transistor 67. A collector electrode of transistor 65 serves as an input or reference terminal of current mirror 66 and is connected to an anode electrode of Zener diode 64. A base electrode of transistor 65 is also connected to the input terminal of current mirror 66. An emitter electrode of transistor 65 and an emitter electrode of transistor 67 are connected together to form a common terminal of current mirror 66, which common terminal is connected to the gate electrode of power MOSFET 52. A base electrode of transistor 67 is connected to the base electrode of transistor 65 and a collector electrode of transistor 67 serves as an output terminal of current mirror 66. It should be understood that the structure of current mirror 66 is not limited to that illustrated in FIG. 2. Current mirror 66 may be replaced by any current mirror having a current flowing out of its common terminal. In addition, transistors 65 and 67 are not limited to being NPN bipolar transistors. For example, transistors 65 and 67 may be replaced by two n-channel insulated gate field effect transistors. However, it should be noted that the type of transistor 65 should be the same as the type of transistor 67, i.e., if transistor 65 is an NPN bipolar transistor, so is transistor 67. When current mirror 66 includes two NPN bipolar transistors as illustrated in FIG. 2, the emitter-base PN junction in transistor 65 serves as a blocking diode. Therefore, blocking diode 55 in clamping element 56 is optional in FIG. 2.

Clamp circuit 50 further includes another current mirror 62. Current mirror 62 has the same structure as current mirror 22 shown in FIG. 1. Current mirror 62 includes two p-channel FETs 61 and 63. A source electrode of FET 61 and a source electrode of FET 63 serve as a common terminal of current mirror 62 and are connected to the second clamping terminal of clamping element 56. A drain electrode of FET 61 serves as an input terminal of current mirror 62 and is connected to the output terminal of current mirror 66. A gate electrode of FET 61 and a gate electrode of FET 63 are connected to the drain electrode of FET 61. A drain electrode of FET 63 serves as an output terminal of current mirror 62. The output terminal of current mirror 62 is connected to a voltage detector 72 and to node 54 via a reference current source 68.

Current source 68 is designed to generate a reference current proportional to the current generated by current source 59. This is achieved by deriving the reference current and the current in current source 59 from one biasing element. In one example, current source 59 and reference current source 68 are related to each other through a current mirror.

Voltage detector 72 has an input terminal connected to the output terminal of current mirror 62. An output terminal 80 of voltage detector 72 is coupled for transmitting an output signal. Voltage detector 72 is illustrated in FIG. 2 as including two inverters 71 and 73. This should not be interpreted as a limitation of the present invention. For example, voltage detector 72 can include a single inverter, a single buffer, or combinations thereof.

In operation, an inductive load 74 such as, for example, a solenoid, is connected to clamp circuit 50 at the drain electrode of power MOSFET 52. Inductive load 74 is also connected to a node 76, which in turn is coupled for receiving a potential such as, for example, a supply voltage, $V_{DD}$. A load current flowing through inductive load 74 and power MOSFET 52 stores an inductive energy in inductive load 74. When a control signal places power MOSFET 52 in a non-conductive state and closes switch 57, the inductive energy stored in inductive load 74 is released and raises the drain voltage of power MOSFET 52. As the drain voltage of power MOSFET 52 reaches a clamping voltage, a clamping current flows through clamping element 56 and Zener diode 64. The clamping current continues to rise until a switching current in the common terminal of current mirror 66 exceeds the current in current source 59. As those skilled in the art are aware, current source 59 will develop a voltage across the gate and source electrodes of power MOSFET 52, and thereby switch power MOSFET 52 into a conductive state. Power MOSFET 52 remains in the conductive state until the inductive energy is dissipated.

For clamp circuit 50, the clamping voltage is the sum of the total avalanche voltage of the Zener diodes in clamping element 56 and Zener diode 64, the voltage across the blocking diode in clamping element 56, the voltage across the collector and emitter electrodes of transistor 65, and the voltage across current switch 58. The activation of clamp circuit 50 occurs when the switching current in the common terminal of current mirror 66 exceeds the current generated by current source 59 and switches power MOSFET 52 on.

Current mirrors 66 and 62 generate an output current in the drain electrode of FET 63. The output current is proportional to the clamping current in Zener diode 64, with the coefficient of proportionality equal to the ratio of W/L of FET 63 to W/L of FET 61 multiplied by the ratio of the emitter area of transistor 67 to that of transistor 65. Reference current source 68 is designed to generate a reference current proportional to the current in current source 59, where the coefficient of proportionality is the same as that of the output current of current mirror 62 in the drain electrode of FET 63 to the switching current in the common terminal of current mirror 66. Thus, the output current of current mirror 62 exceeds the reference current when clamp circuit 50 is activated. In response to the output current exceeding the reference current, reference current source 68 develops a voltage at the input terminal of voltage detector 72. Voltage detector 72 in turn generates a logical high digital signal at output terminal 80 indicating the activation of clamp circuit 10.

By now it should be appreciated that a clamp circuit for the protection of a power transistor and a method for detecting the activation of the clamp circuit have been provided. The method in accordance with the present invention uses a current mirror to sense a current in the Zener diode that is sufficient to switch on the power transistor, and thereby ensures that detection occurs when the clamp circuit is activated. The clamp circuit in accordance with the present invention does not require additional voltage or current supplies, and operates independently of the supply voltage. In contrast to the prior art methods for detecting the activation of a clamp circuit, the present invention does not increase the drain leakage current of the power transistor. To minimize the silicon area of the circuit, the p-channel MOSFET mirror in the clamp circuit can be built in a Zener diode stack epitaxy layer. The method is insensitive to the variation in the Zener diode clamp voltage that may be caused by process variation and temperature range variation. Therefore, the present invention provides a simple clamp circuit and reliable method for the diagnostic of the states of the clamp circuit and its inductive load.

We claim:

1. A clamp circuit, comprising:
    a clamping element having a first clamping terminal and a second clamping terminal, wherein the first clamping terminal is coupled for receiving a load signal;

a first current mirror having an input terminal, an output terminal, and a common terminal, wherein the common terminal is coupled to the second clamping terminal of the clamping element;

a current switch having a first terminal and a second terminal, wherein the first terminal is coupled to the input terminal of the first current mirror and the second terminal is coupled for receiving a reference potential;

a current source having a first terminal and a second terminal, wherein the first terminal is coupled to the output terminal of the first current mirror and the second terminal is coupled to the second terminal of the current switch; and a voltage detector having an input terminal and an output terminal, wherein the input terminal is coupled to the first terminal of the current source.

2. The clamp circuit of claim 1, further including a transistor having a control electrode, a first current conducting electrode, and a second current conducting electrode, wherein the control electrode is coupled for receiving a control signal and to the first terminal of the current switch, the first current conducting electrode is coupled to the second terminal of the current switch, and the second current conducting electrode is coupled to the first clamping terminal of the clamping element for receiving the load signal.

3. The clamp circuit of claim 1, wherein the clamping element comprises:

a blocking diode having an anode electrode and a cathode electrode, wherein the anode electrode serves as the first clamping terminal of the clamping element; and a first Zener diode having an anode electrode and a cathode electrode, wherein the cathode electrode is coupled to the cathode electrode of the blocking diode and the anode electrode serves as the second clamping terminal of the clamping element.

4. The clamp circuit of claim 1, wherein the first current mirror comprises:

a first mirror transistor of a first type having a control electrode, a first current conducting electrode, and a second current conducting electrode, the control electrode coupled to the input terminal of the first current mirror, the first current conducting electrode coupled to the common terminal of the first current mirror, and the second current conducting electrode coupled to the input terminal of the first current mirror; and a first image transistor of the first type having a control electrode, a first current conducting electrode, and a second current conducting electrode, the control electrode coupled to the control electrode of the first mirror transistor, the first current conducting electrode coupled to the common terminal of the first current mirror, and the second current conducting electrode coupled to the output terminal of the first current mirror.

5. The clamp circuit of claim 4, wherein the first mirror transistor is a p-channel insulated gate field effect transistor.

6. The clamp circuit of claim 1, wherein the current switch comprises a switch and a current source coupled in a series combination.

7. The clamp circuit of claim 1, wherein the voltage detector comprises at least one inverter.

8. The clamp circuit of claim 1, wherein the first terminal of the current switch is coupled to the input terminal of the first current mirror via a second Zener diode, wherein the second Zener diode has an anode electrode coupled to the first terminal of the current switch and a cathode electrode coupled to the input terminal of the first current mirror.

9. The clamp circuit of claim 1, further including;

a second current mirror for coupling the first terminal of the current switch to the input terminal of the first current mirror, wherein the second current mirror has an input terminal, an output terminal coupled to the input terminal of the first current mirror, and a common terminal coupled to the first terminal of the current switch; and a third Zener diode having an anode electrode and a cathode electrode, wherein the anode electrode is coupled to the input terminal of the second current mirror and the cathode electrode is coupled to the common terminal of the first current mirror.

10. The clamp circuit of claim 9, wherein the second current mirror comprises:

a second mirror transistor of a second type, wherein the second mirror transistor has a control electrode coupled to the input terminal of the second current mirror, a first current conducting electrode coupled to the common terminal of the second current mirror, and a second current conducting electrode coupled to the input terminal of the second current mirror; and a second image transistor of the second type, wherein the second image transistor has a control electrode coupled to the control electrode of the second mirror transistor, a first current conducting electrode coupled to the common terminal of the second current mirror, and a second current conducting electrode coupled to the output terminal of the second current mirror.

11. The clamp circuit of claim 10, wherein the second mirror transistor is an NPN bipolar transistor.

12. A clamp circuit, comprising:

a transistor having a control electrode, a first current conducting electrode, and a second current conducting electrode, wherein the control electrode is coupled for receiving a control signal, the first current conducting electrode is coupled for receiving a first reference potential, and the second current conducting electrode is coupled for receiving a second reference potential;

a clamping element having a first clamping terminal and a second clamping terminal, wherein the first clamping terminal is coupled to the second current conducting electrode of the transistor;

a first current mirror having an input terminal, an output terminal, and a common terminal, wherein the common terminal is coupled to the second clamping terminal of the clamping element and the input terminal is coupled to the control electrode of the transistor;

a current switch having a first terminal and a second terminal, wherein the first terminal is coupled to the control electrode of the transistor and the second terminal is coupled to the first current conducting electrode of the transistor;

a current source having a first terminal and a second terminal, wherein the first terminal is coupled to the output terminal of the first current mirror and the second terminal is coupled to the first current conducting electrode of the transistor; and a voltage detector having an input terminal and an output terminal, wherein the input terminal is coupled to the first terminal of the current source.

13. The clamp circuit of claim 12, wherein the input terminal of the first current mirror is coupled to the control electrode of the transistor via a Zener diode, wherein the Zener diode has a cathode electrode coupled to the input terminal of the first current mirror and an anode electrode coupled to the control electrode of the transistor.

14. The clamp circuit of claim 12, further comprising:

a second current mirror for coupling the input terminal of the first current mirror to the control electrode of the transistor, wherein the second current mirror has an input terminal, an output terminal coupled to the input terminal of the first current mirror, and a common terminal coupled to the control electrode of the transistor; and a Zener diode having an anode electrode and a cathode electrode, wherein the anode electrode is coupled to the input terminal of the second current mirror and the cathode electrode is coupled to the common terminal of the first current mirror.

15. A method for detecting activation of a clamp circuit, comprising the steps of:

providing the clamp circuit including a clamping element, wherein the clamping element has an avalanche voltage;

providing a reference current;

generating a first voltage across the clamping element;

generating a first current through the clamping element in response to the first voltage exceeding the avalanche voltage of the clamping element;

generating a second current in proportion to the first current; and generating a signal indicating the activation of the clamp circuit in response to the second current exceeding the reference current.

16. The method for detecting activation of a clamp circuit as claimed in claim 15, wherein the step of providing the clamp circuit includes the steps of:

providing a current switch;

providing a transistor having a control electrode, a first current conducting electrode, and a second current conducting electrode, wherein the control electrode is coupled to the first current conducting electrode via the current switch and coupled to the second current conducting electrode via the clamping element;

coupling the control electrode of the transistor for receiving a control signal; and coupling an inductive load to the second current conducting electrode of the transistor.

17. The method for detecting activation of a clamp circuit as claimed in claim 16, wherein the step of generating a first voltage includes the steps of:

placing the transistor in a conductive state by applying a control signal to the control electrode of the transistor;

storing inductive energy in the inductive load by passing a load current through the inductive load and the transistor; and generating the first voltage from the inductive energy.

18. The method for detecting activation of a clamp circuit as claimed in claim 17, wherein the step of generating the first voltage from the inductive energy further includes the steps of:

releasing the inductive energy from the inductive load by removing the control signal applied to the control electrode of the transistor to place the transistor in a non-conductive state and by generating a third current through the current switch;

generating the first voltage using the inductive energy released from the inductive load; and placing the transistor in a conductive state in response to the first current exceeding the third current.

19. The method for detecting activation of a clamp circuit as claimed in claim 18, wherein the step of providing a reference current includes providing the reference current in proportion to the third current.

20. The method for detecting activation of a clamp circuit as claimed in claim 15, wherein the step of generating a signal indicating the activation of the clamp circuit includes generating a digital signal.

* * * * *